United States Patent
Watkins

(10) Patent No.: US 9,954,490 B2
(45) Date of Patent: Apr. 24, 2018

(54) AMPLIFIER CIRCUITRY FOR ENVELOPE MODULATORS, ENVELOPE MODULATORS INCORPORATING SAID AMPLIFIER CIRCUITRY AND METHOD OF MODULATING A SIGNAL ENVELOPE

(71) Applicant: Kabushiki Kaisha Toshiba, Minato-ku (JP)

(72) Inventor: Gavin Watkins, Bristol (GB)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/039,316

(22) PCT Filed: Mar. 27, 2014

(86) PCT No.: PCT/GB2014/050991
§ 371 (c)(1),
(2) Date: May 25, 2016

(87) PCT Pub. No.: WO2015/145097
PCT Pub. Date: Oct. 1, 2015

(65) Prior Publication Data
US 2017/0133985 A1    May 11, 2017

(51) Int. Cl.
*H03G 3/20* (2006.01)
*H03F 1/02* (2006.01)
(Continued)

(52) U.S. Cl.
CPC ........... *H03F 1/0222* (2013.01); *H03F 1/025* (2013.01); *H03F 3/193* (2013.01); *H03F 3/265* (2013.01);
(Continued)

(58) Field of Classification Search
CPC ..... H03F 1/0222; H03F 1/0238; H03F 1/0211
(Continued)

(56) References Cited

U.S. PATENT DOCUMENTS 5,767,735 A   6/1998  Javanifard et al.
5,781,473 A   7/1998  Javanifard et al.
(Continued)

FOREIGN PATENT DOCUMENTS

WO   WO 2012/027619 A1   3/2012
WO   WO 20141135823 A1   9/2014

OTHER PUBLICATIONS

International Search Report dated Jul. 1, 2014, in PCT/GB2014/050991 filed Mar. 27, 2014.
(Continued)

*Primary Examiner* — Steven J Mottola
(74) *Attorney, Agent, or Firm* — Oblon, McClelland, Maier & Neustadt, L.L.P.

(57) ABSTRACT

An amplifier circuitry for an envelope modulator including: a linear amplifier configured to receive an input representing an envelope of a signal to be amplified; a charge storage device coupled to the amplifier for providing an amplified envelope signal for driving a load, the amplifier and charge storage device configured to receive a supply voltage; wherein the amplifier circuitry is configured such that responsive to the voltage of the input envelope signal reaching or exceeding a defined threshold value, an input voltage based on the voltage of the received envelope signal is provided to the amplifier to enable the charge storage device to supply a charge above the supply voltage such that the output voltage of the load driven by the amplifier circuitry is increased above the supply voltage. An envelope modulator incorporates the modulator and a method for amplifying an envelope signal utilizes the modulator.

15 Claims, 6 Drawing Sheets

(51) Int. Cl.
  *H03F 3/26* (2006.01)
  *H03F 3/193* (2006.01)

(52) U.S. Cl.
  CPC .. *H03F 2200/102* (2013.01); *H03F 2200/267* (2013.01); *H03F 2200/451* (2013.01)

(58) Field of Classification Search
  USPC ........................................ 330/127, 136, 297
  See application file for complete search history.

(56) References Cited

U.S. PATENT DOCUMENTS

| | | | |
|---|---|---|---|
| 6,636,103 B2 | 10/2003 | Wurcer et al. | |
| 6,917,245 B2 * | 7/2005 | Dupuis ................ | H01L 23/645 330/102 |
| 7,859,336 B2 | 12/2010 | Markowski et al. | |
| 8,098,093 B1 | 1/2012 | Li | |
| 8,188,790 B1 | 5/2012 | Damitio et al. | |
| 2002/0153940 A1 | 10/2002 | Wurcer et al. | |
| 2009/0184764 A1 | 7/2009 | Markowski et al. | |
| 2010/0237944 A1 | 9/2010 | Pierdomenico et al. | |
| 2013/0093247 A1 | 4/2013 | Park et al. | |
| 2014/0273897 A1 * | 9/2014 | Drogi ................... | H04B 1/0458 455/127.3 |

OTHER PUBLICATIONS

Written Opinion of the International Searching Authority dated Jul. 1, 2014, in PCT/GB2014/050991, filed Mar. 27, 2014.
Jeffrey S. Walling, "A Class-G Supply Modulator and Class-E PA in 130 nm CMOS", IEEE JSSC 2009, vol. 44 Issue 9, pp. 2339-2347.
D. Self, "Class Distinction", Electronics World Mar. 1999, pp. 190-195.
Hyungchui Kim, "Efficiency Enhanced Amplifier Using a Digitally-Controlled Dynamic Bias Switching Circuit". Microwave Journal—May 2013, pp. 106-120.
John Pierdomenico. "A 684-mW Adaptive Supply Full-Rate ADSL CO Driver", IEEE Journal of Solid-State Circuits, vol. 37, No. 12, Dec. 2002, pp. 1831-1838.

* cited by examiner

US 9,954,490 B2

AMPLIFIER CIRCUITRY FOR ENVELOPE MODULATORS, ENVELOPE MODULATORS INCORPORATING SAID AMPLIFIER CIRCUITRY AND METHOD OF MODULATING A SIGNAL ENVELOPE

FIELD

Embodiments described herein relate generally to amplifier circuitry and power efficient envelope modulators. Embodiments described herein specifically relate to amplifier circuitry having an envelope amplifier with a charge storage device coupled to said amplifier for driving a supply voltage of an RF amplifier. Embodiments also relate to envelope modulators incorporating such amplifier circuits and methods for amplifying a signal.

BACKGROUND

Envelope modulators often use a linear class AB or a class B amplifier to amplify high frequency AC signal components. Envelope modulators that use such an amplifier to amplify the entire bandwidth of a signal are inherently inefficient. Another type of envelope modulator splits the frequencies of the signals to be operated upon and applies only a higher signal frequency component to a linear amplifier and a low frequency signal component to a switched mode power supply, thereby increasing the efficiency to some degree. However, this configuration has two draw backs. Firstly the frequency response of the modulator is distorted by a null present in the amplitude response and a phase flip in the phase response. These effects degrade the signal fidelity which contributes to the error vector magnitude (EVM) and adjacent channel power ratio (ACPR). Secondly, splitting the envelope in the frequency domain requires a large inductor in a combining network, which takes up considerable board space making this architecture unsuitable for integrated circuit integration and expensive. A further type of envelope modulator includes two or more amplifiers cascaded or stacked with power supplies, where the output of one amplifier drives the power supply of the next amplifier in the amplifier stack for providing an amplified output. The presence of multiple amplifiers in this type of envelope modulator requires synchronisation of the amplifiers in gain and in the time domain, which can cause distortion.

BRIEF DESCRIPTION OF THE DRAWINGS

Embodiments of the present invention will now be described by way of example only and with reference to the accompanying drawings, in which.

DETAILED DESCRIPTION

Figure 1:
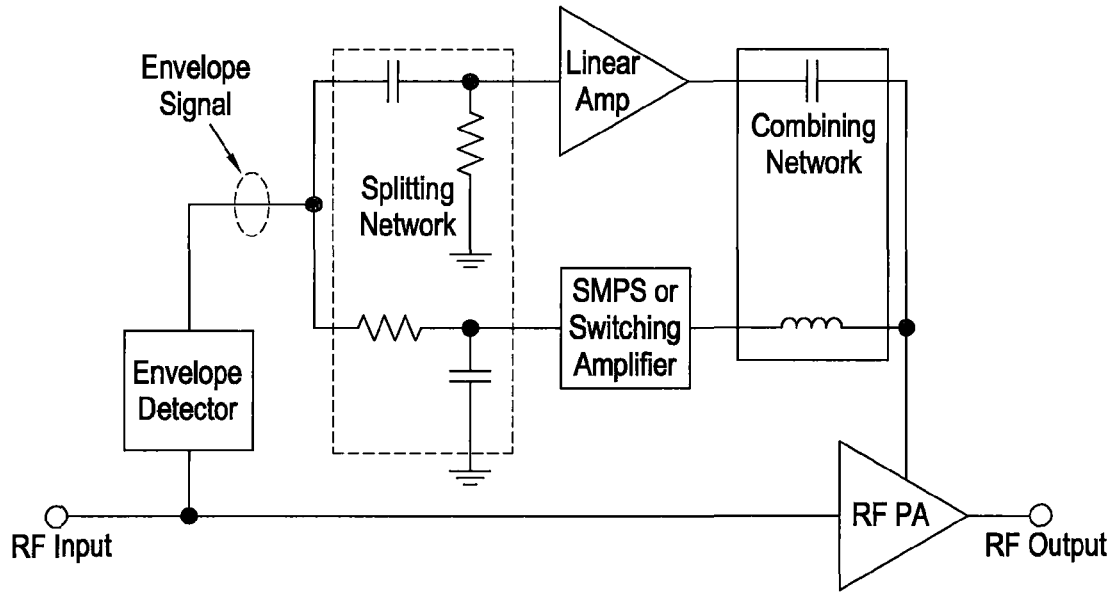
FIG. 1 shows a split frequency envelope modulator that currently exists.

The embodiments provide an amplifier circuitry with a single envelope amplifier coupled to a charge storage device to increase efficiency for envelope modulation applications, when the circuitry is used in an envelope modulator.

According to one embodiment, there is provided amplifier circuitry for an envelope modulator comprising a linear amplifier capable of receiving an input representing an envelope of a signal to be amplified; a charge storage device coupled to said amplifier for providing an amplified envelope signal for driving a load, said amplifier and charge storage device being arranged to receive a supply voltage V+; wherein the amplifier circuitry is configured such that responsive to the voltage of the input envelope signal reaching or exceeding a defined threshold value Vt, an input voltage V1 based on the voltage of the received envelope signal is provided to the amplifier to enable the charge storage device to supply a charge V3 above the supply voltage V+ such that the output voltage of the load driven by the amplifier circuitry is increased above the supply voltage V+.

According to another embodiment, there is provided an envelope modulator comprising the amplifier circuitry as set out above, the envelope modulator further including:

an RF input for receiving an RF signal that is to be amplified;

an envelope detector for providing an envelope input signal indicative of an instantaneous magnitude of the envelope of said RF signal to said amplifier circuitry; and an RF power amplifier for providing an amplified RF output signal;

wherein, the amplifier circuitry is configured to feed an amplified envelope signal output to a voltage supply input of the RF power amplifier.

In another embodiment there is provided a method for amplifying a signal using the amplifier circuitry set out above comprising the steps of:

providing an input signal representing an envelope of a signal to be amplified to a linear amplifier;

providing a charge storage device coupled to the amplifier for providing an amplified envelope signal for driving a load;

providing a supply voltage V+ to the amplifiers and charge storage device;

wherein, responsive to the voltage of the input envelope signal reaching or exceeding a defined threshold value Vt, providing an input voltage V1 based on the voltage of the received envelope signal to the amplifier to enable the charge storage device to supply a charge V3 above the supply voltage V+, such that the output voltage of the load driven by the amplifier circuitry is increased above the supply voltage V+.

In a further embodiment there is provided an envelope modulation method implemented by the envelope modulator set out above, comprising the steps of:
providing an RF input for receiving an RF signal that is to be amplified;
providing an envelope input signal by an envelope detector to the amplifier circuitry of the envelope modulator, said signal indicative of an instantaneous magnitude of the envelope of said RF signal;
amplifying the envelope signal in the amplifier circuitry having a plurality of amplifiers and one or more charge storage devices, and providing an amplified output; and
providing the amplified output to a voltage supply input of an RF power amplifier for amplifying the RF signal.

Known envelope modulators are generally based on a split-frequency architecture such as shown in FIG. 1 comprising a frequency separator arranged to separate a high frequency AC component of an envelope signal to be modulated and a low frequency DC component of the envelope signal, and to provide the high frequency component to a first output and the low frequency component to a second output. The frequency separator comprises a high pass filter and a low pass filter provided in parallel with a common input. A linear amplifier is used in the high frequency path AC such as shown in FIG. 1 to amplify the signal passed by the high pass filter and a capacitor is used to feed this to an RF amplifier. The low frequency signal path uses a switched mode power supply (SMPS) to amplify the low frequency components of the envelope signal and this is fed to the RF amplifier via an inductor. The inductor and capacitor forms a combining network in the envelope modulator of FIG. 1.

Though the efficiency of this configuration may be improved by using a class G or class H amplifier in the high frequency path, split frequency envelope modulators such as shown in FIG. 1 are hindered by the fact that the high frequency AC and the low frequency DC components of the envelope signal are provided by two separate amplifiers. The two components must be combined by a frequency selective network based on a capacitor and inductor. The inductor of this network is usually very large in value, therefore taking up a large board space as well as being expensive. This frequency selective network will also introduce distortion at the crossover frequency which is not desirable.

Figure 2:
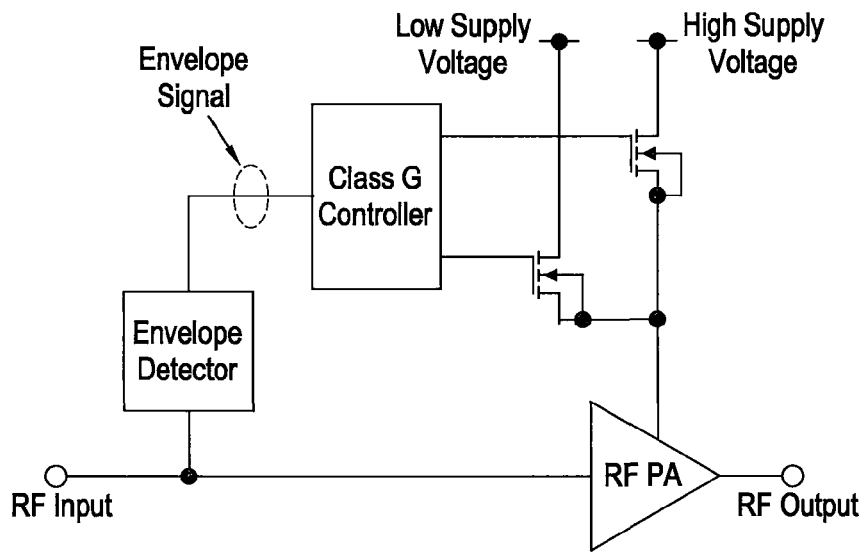
FIG. 2 shows a DC coupled envelope modulator using class G techniques that currently exists.

FIG. 2 shows a known alternative configuration where the envelope modulator is of a single band type and uses a class G amplifier configuration. In contrast to the split-frequency envelope modulators shown in FIG. 1 the entire bandwidth of the envelope signal is applied to the input of the class G amplifier in this configuration. The class G amplifier has a bandwidth that is sufficient to amplify the entire bandwidth of the envelope signal so that the output signal provided by the amplifier provides a low frequency or DC output as well as high frequency AC output, both reflecting the low frequency/DC and the AC components of the input envelope signal. The voltage output by the class G amplifier of the envelope modulator in FIG. 2 is directly applied to the RF amplifier.

Though this amplifier configuration in FIG. 2 does not result in a null value in the frequency domain, this has a lower efficiency when compared to split-frequency architecture since it amplifies the entire bandwidth of the signal.

Figure 3:
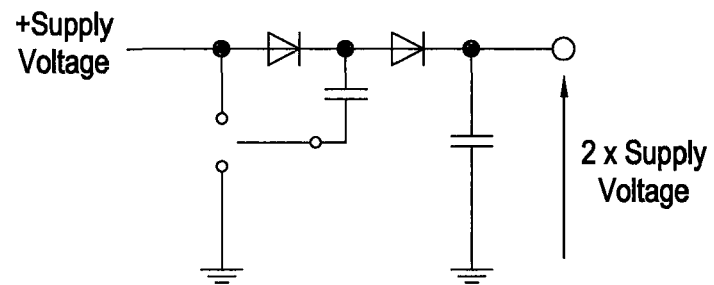
FIG. 3 shows a known charge pump voltage doubler.

A charge pump as shown in FIG. 3 is capable of producing an output voltage which is double its input. In such an arrangement a switch is used to alternatively charge one capacitor from the supply voltage and then switch it in series with the supply voltage. When connected in series with the supply voltage, charge is passed to the output capacitor which maintains twice the supply voltage. A number of charge pumps can be cascaded to achieve higher output voltages. However the charge pumps are not generally dynamically controllable and the output voltage is non-linear and is always a multiple of the input.

Figure 4:
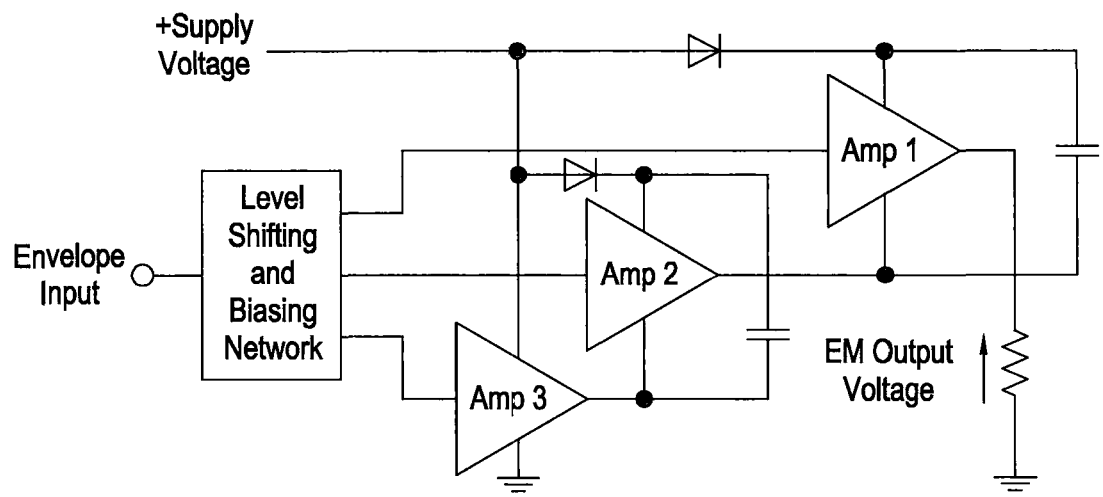
FIG. 4 shows an existing amplifier circuitry for an envelope modulator having two or more amplifiers coupled to each other.

FIG. 4 shows an existing stacked amplifier structure, i.e. incorporating cascaded amplifiers for use in an envelope modulator. This figure shows a plurality of amplifiers coupled with charge pumps for driving a resistive load, which represents an RF Power Amplifier with a voltage produced across the load. In this figure, three amplifiers Amp 1, Amp 2 and Amp 3 are cascaded with floating power supplies (represented as capacitors), such that the output of one amplifier drives the power supply for the next amplifier. When the envelope input is in a middle range or upper range, a voltage is provided to Amp 2 and/or Amp 3, which in turn feeds into the input of Amp 1. This raises the voltage given to the RF amplifier to above an initial supply voltage. Though the circuitry shown in FIG. 4 overcomes some of the drawbacks presented in the envelope amplifiers of FIGS. 1 and 2, multiple amplifiers and a plurality of charge pump devices require synchronisation of the amplifiers and switches, which causes a lot of distortion.

Figure 5:
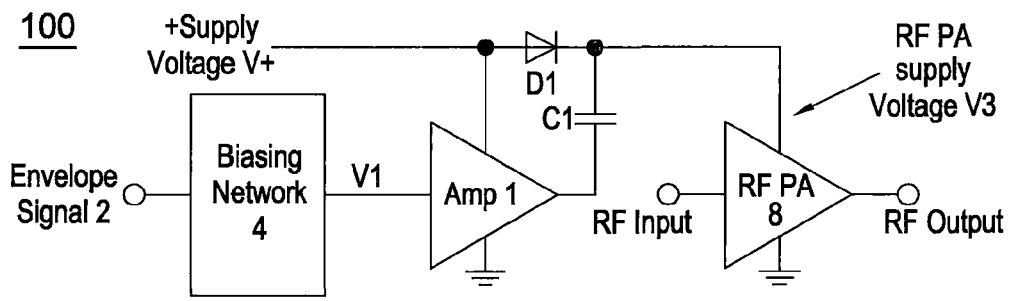
FIG. 5 shows an amplifier circuit having a single envelope amplifier with a charge storage device coupled said amplifier, according to a first embodiment.

The described embodiments overcome the drawbacks of existing amplifier configurations for envelope modulators by providing a single linear amplifier coupled with a charge storage device or a linear charge pump to drive a supply voltage to an RF power amplifier when an envelope input is over a threshold voltage level. FIG. 5 shows amplifier circuitry 100 for an envelope modulator according to a first embodiment. The output signal of the envelope amplifier Amp 1 of FIG. 5 drives a linear charge pump, i.e. a charge storage device C1, to improve efficiency and linearity of the output signal, which is supplied to an RF amplifier (RF PA) 8. The components of the circuitry 100 shown in FIG. 5 are explained in detail below.

An envelope input 2 is provided to a biasing network 4, which is preferably a level shifting and biasing network. This envelope input 2 represents a signal provided from an envelope detector of an envelope modulator incorporating circuitry 100, or from baseband processing (not shown in FIG. 5) that is indicative of an instantaneous magnitude of the envelope of an RF signal (not shown in FIG. 5) that is to be amplified by the amplifier circuitry 100. The biasing network 4 includes a circuit that produces biased voltages for driving the linear amplifier Amp 1 based on the voltage range of the input envelope signal 2. The biasing network 4 is configured to receive the envelope of a signal and provide an input signal V1 to amplifier Amp 1 based on the voltage of the envelope input.

A positive supply voltage V+ is provided to the linear amplifier and the charge storage device C1 coupled to the single linear amplifier Amp 1 in amplifier circuitry 100. The amplifier circuitry 100 is configured to drive an output load represented by the RF power amplifier RF PA 8 in FIG. 5. RF PA 8 which receives a supply voltage V3 from the amplifier circuitry 100, and which in turn supplies an AC voltage to an output RF load.

The amplifier circuitry 100 is configured to provide an output signal to drive the supply voltage V3 supplied to the RF PA 8 for driving the output load. The circuitry 100 is configured to such that it the envelope amplifier Amp 1 does not completely track the entire envelope of the RF carrier.

When the voltage of the input envelope signal is at or above a predetermined voltage threshold level Vt, only then a voltage appears at V1 and this is input to Amp 1; V1 being based on the voltage range of the input envelope signal 2 that is above the determined threshold. Preferably, the voltage threshold Vt is set at or above the mean value of the dynamic voltage range of the envelope signal 2, so that V1 always tracks the upper voltage range of the dynamic voltage range of the envelope signal 2. The signal V1 of the envelope amplifier Amp 1 is then passed to a charge storage device C1, which acts as a linear charge pump to provide an output signal V3 to the RF PA 8, such that this at a voltage higher than the supply voltage V+ for driving the RF PA 8. Above the threshold Vt, the RF PA 8 operates in a non-linear or a saturation mode, i.e. above the mean voltage range, and therefore in this mode it is the peaks of the envelope input signal 2 that are tacked by Amp 1. Thus, in the saturation mode current flows through Amp 1 to the charge the charge storage device shown as capacitor C1 to above the supply voltage V+.

If the voltage range of the envelope input 2 is below Vt, then no input voltage appears at V1 from the biasing network 4 based on the envelope signal. In this case, the input to Amp 1 will be at zero V or at ground potential. Therefore, below threshold Vt, the output signal V3 to the RF PA 8 is fixed at the supply voltage V+. Thus, during this time the RF PA operates in a linear mode at the supply voltage V+, as the lower voltage range of the input envelope signal is not taken into consideration by Amp 1. In the linear mode, current flows through a diode D1 shown in FIG. 5 to charge capacitor C1 to the supply voltage V+. Therefore, in the non-linear or saturation mode current flows through Amp 1 to the load RF PA 8. During the linear mode, current flows through diode D1, capacitor C1 and Amp 1, such that capacitor C1 is charged so a potential equal to V+ exists across it.

Figure 6:
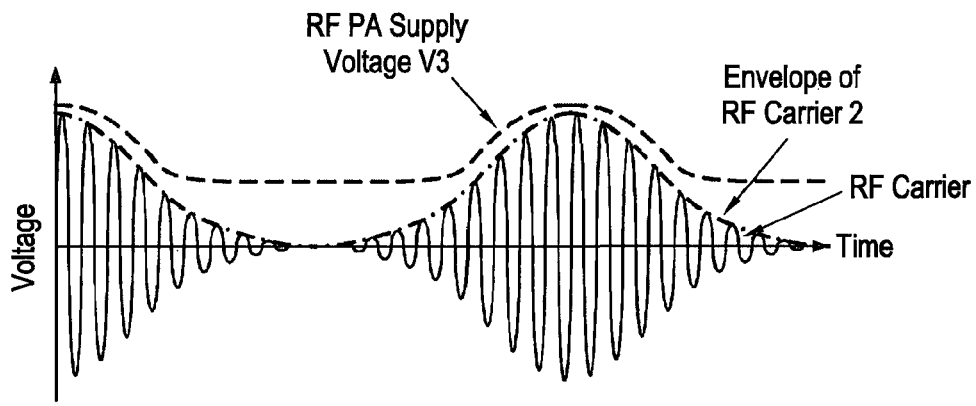
FIG. 6 shows a waveform indicating the supply voltage of an RF amplifier driven by the amplifier circuitry of FIG. 5.

FIG. 6 shows the range of the RF PA 8 supply voltage V3. The envelope of the RF carrier represents the envelope signal 2 provided to the biasing network 4 in FIG. 5. In an envelope modulator, the envelope signal 2 can be derived from the input RF carrier or digital baseband. In the circuitry 100 shown in FIG. 5, the full bandwidth of the envelope signal is supplied to the RF PA 8 by Amp 1 and there is no frequency splitting such as in the architecture shown in FIG. 1.

Figure 7:
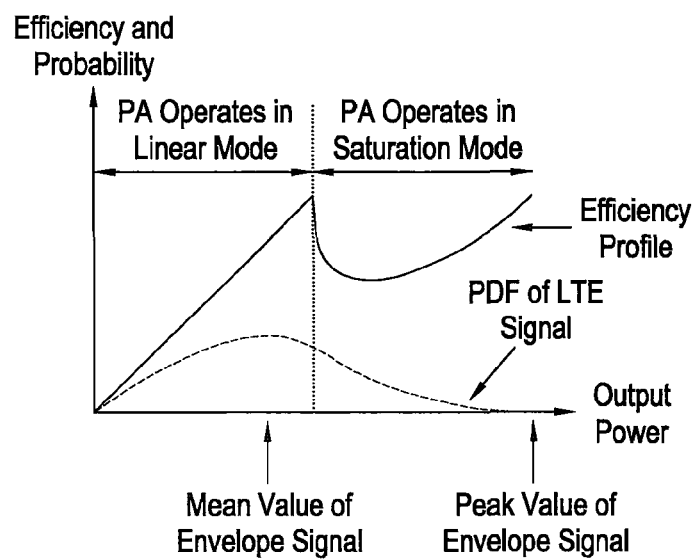
FIG. 7 shows a graph depicting an efficiency profile of the amplifier circuitry of FIG. 5.

Because the RF PA 8 supply voltage V3 only tracks the upper region of the envelope signal 2 as shown in FIG. 6, the RF PA 8 spends most of its time in the linear mode as indicated by FIG. 7. The mean value (the peak of the probability density function curve) is below the threshold between the regions. The RF PA 8 only operates in a non-linear or saturated mode during the peaks, which have a low probability of occurrence. Most of the time RFPA 8 operates in the linear mode, keeping distortion to a very low and negligible level.

With regard to FIG. 7, RF PA 8 operates in two modes, a linear mode in the lower region of its dynamic range where current to the RF PA 8 flows through D1 in FIG. 5. During the saturation mode, the RF PA 8 supply voltage V3 tracks the upper region of the RF signal's dynamic range. The RF PA 8 operates in a saturation mode in this upper region, so that its RF output voltage (RF out) is close to the supply voltage V3 and high efficiency is maintained.

A bias current to the RF PA 8 is set to typically a quarter of the peak current so that the gain of the RF PA is constant over the whole dynamic range of the signal, improving linearity further. A high bias current ensures that the RF PA 8 operates in a linear mode while in the lower region shown in FIG. 7.

The biasing network 4 shown in FIG. 5 preferably comprises a zener diode configuration (not shown) and is configured to provide an input signal to Amp 1 if the voltage of the envelope input exceeds the breakdown voltage of a zener diode controlling the input V1 for Amp 1. If the envelope signal voltage range is at or above the threshold voltage Vt, a voltage appears at V1 for driving Amp 1 to indicate that the envelope input 2 is at or above the mean voltage range.

The amplifier circuitry 100 of the described embodiments as shown in FIG. 5 improves efficiency of an RF amplifier and provides a simplified circuit for doing so. As only a single envelope amplifier is present, linearity of the output voltage is increased without any distortion in the frequency domain. Improved linearity of the signal is desirable, as this will be void of any distortion. Furthermore, the more linear the output provided to an RF power amplifier, less operation is required from other circuits in the RF PA 8 such as a pre-distorter etc. (not shown), which can otherwise be expensive, consume more power and board area. Also, as only an upper range, i.e. the peaks of the envelope above a certain threshold, of the envelope input is tracked rather than the entire voltage range, such a circuit is more efficient than the class G amplifier circuit shown in FIG. 2. Synchronising is not required for the amplifier circuit of the present embodiments, as there is only one envelope amplifier present, which makes the circuit more efficient and having less distortion than the circuits shown in FIGS. 1 and 4. The amplifier circuits according to the described are easy to reproduce of low cost and a compact size.

The embodiments are suitable for use with linear amplifiers intended for high peak-to-average power ratio (PAPR) modulation schemes like OFDM, for example the LTE or DVB standards, using envelope tracking and modulation. The amplifier circuit 100 according to the described embodiments are most suitable for use in low power and mid power discrete chip designs and low power CMOS Integrated circuits, i.e. 100 mW. Unlike the split-frequency amplifier circuit shown in FIG. 1, large inductors in combining circuits are not required thereby reducing the cost and chip size if implemented in CMOS. The amplifier circuitry 100 of the described embodiments can be applied in mobile terminals and in base stations. The simplicity of the circuit makes it suitable for use in low power applications such as Wi-Fi chipsets and Pico-cells.

Preferred aspects of the amplifier circuit 100 of FIG. 5 according to the first embodiment are set out below shown in FIGS. 8 to 10.

The single linear envelope amplifier Amp 1 as shown in FIG. 5 can be configured with a totem pole output architecture. As the envelope amplifier (Amp 1 in FIG. 5) is required to pass a large current at high speed, the totem pole architecture may be more suitable for medium and high power applications. In this architecture, the linear envelope amplifier Amp 1 circuit comprises amplifiers A1 and A2 and a push-pull output driver configured using two transistors Q1 and Q2 of the same polarity, and which can be arranged to supply opposite halves of each cycle without the need for an output transformer. The driver circuit is often asymmetric and one transistor may be used in a common-emitter configuration while the other is used as an emitter-follower.

In a preferred aspect, Q1 is configured to operate in a common source configuration to sink current. When V1 is low (below Vt), supply voltage V3 for RF PA 8 is equal to V+ current flows through Q1 and D1 to charge capacitor C1.

Q2 is configured to operate as a source follower and sources current. When V1 is high (at or above Vt) current will flow through Q2 defining a potential at its drain (lower terminal). Q1 is turned off in this case, so current only flows through Q2. This potential raises C1, so that the voltage at its top terminal is now greater than V+. Current then flows from V+ though Q2, C1 and the RF PA 8 and C1 will tend to discharge. A discrete implementation of the totem pole architecture for amplifier circuitry 100 is shown in FIG. 8, FIG. 9 and FIG. 10.

Figure 8:
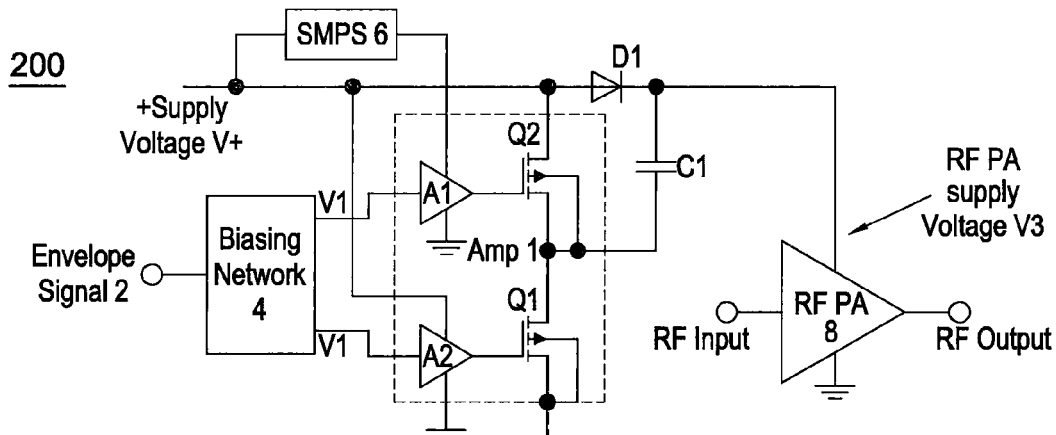
FIG. 8 shows an amplifier circuitry according to a first preferred aspect of the embodiments.
Figure 9:
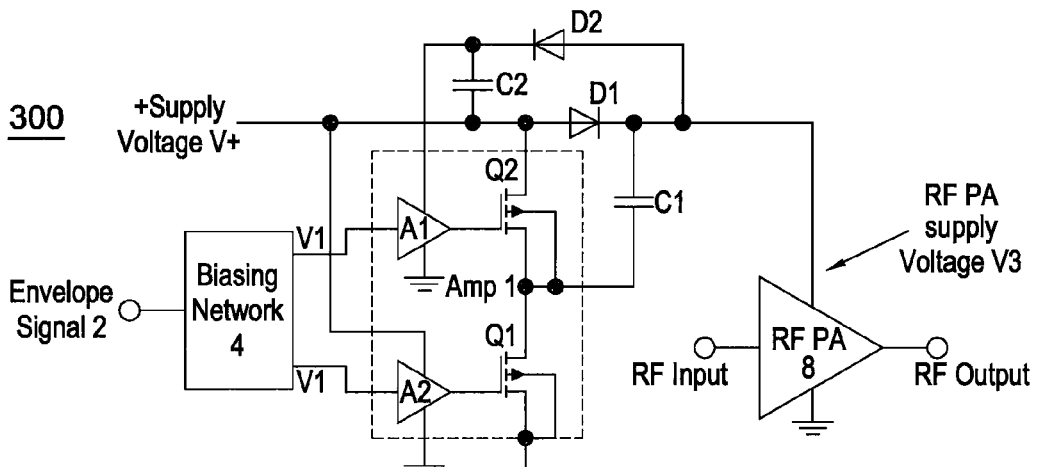
FIG. 9 shows an amplifier circuitry according to a second preferred aspect in of the embodiments.
Figure 10:
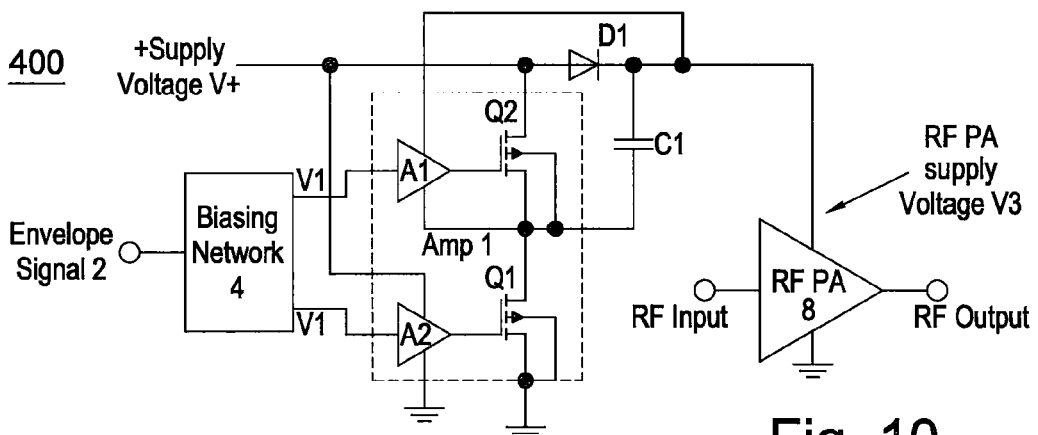
FIG. 10 shows an amplifier circuitry according to third preferred aspect of the embodiments.

To ensure that the peaks of the envelope input 2 can be accurately recreated and tracked according to the described embodiments, the voltage drop across transistor Q2 shown in FIGS. 8-10 must be small. If an N-channel upper MOSFET (Q2) is used as in FIGS. 8-10, then the output of A1 needs to swing above the supply voltage during the saturation region. FIG. 8, FIG. 9 and FIG. 10 show different ways of facilitating this. To ensure that the voltage across the drain and source of MOSFET Q2 is very small, i.e. almost zero, as seen in the amplifier circuitry 100 of FIGS. 8-10, the gate terminal is preferably about 4V above its source drain terminal. It therefore follows that the gate must go above the supply voltage +V In FIG. 8 an amplifier circuitry 200 is shown where the envelope amplifier represented in totem pole architecture with amplifiers A1, A2 and transistors Q1 and Q2 as part of the envelope amplifier circuit Amp 1. In FIG. 8, a switched mode power supply SMPS 6 is provided to generate a DC voltage higher than the supply voltage V+ for amplifier A1.

FIG. 9 shows an amplifier circuitry 300 similar to that of circuitry 200 shown in FIG. 8 along with an additional charge pump C2 and diode D2 in the amplifier circuitry 300. This configuration can supply amplifier A1 with twice the supply voltage due to D2 and C2.

FIG. 10 shows an amplifier circuitry 400 which is a simplification of the totem pole envelope amplifier architecture of FIGS. 8 and 9. In amplifier circuitry 400, the supply voltage for amplifier A1 tracks the output voltage V3 of the RF PA 8. Its ground return is now tied to the node between MOSFETs Q1 and Q2.

Figure 11:
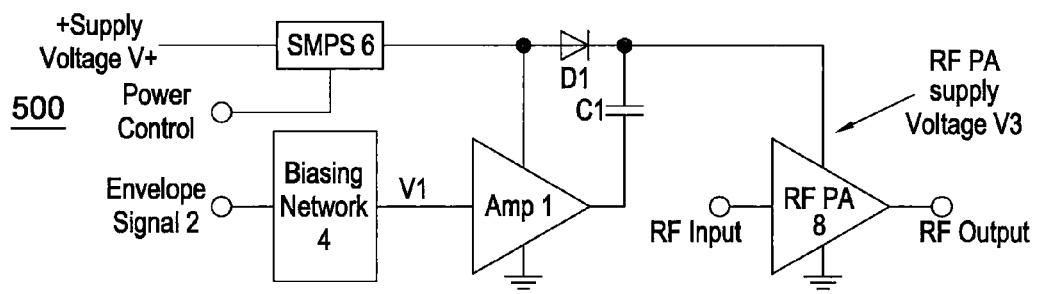
FIG. 11 shows an amplifier circuitry according to a second embodiment, an SMPS added for power control.

An amplifier circuitry according to a second embodiment is shown in FIG. 11. Amplifier circuitry 500 for an envelope modulator shown in FIG. 11 is similar to the amplifier circuitry 100 of the first embodiment shown in FIG. 5, with an SMPS 6 included. The operation is the same as described above in relation to FIG. 5. The added SMPS 6 in circuitry 500 for the supply voltage V+ provides the advantage of achieving output power control, which increases the overall efficiency of the circuit 500.

Figure 12:
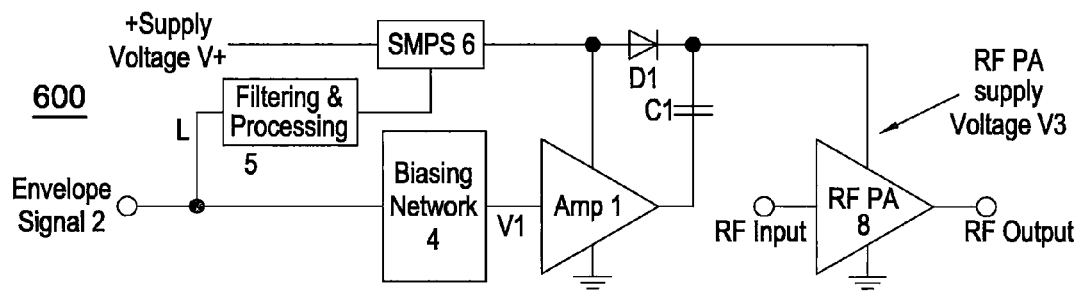
FIG. 12 shows an amplifier circuitry according to a third embodiment.

FIG. 12 shows a third embodiment including amplifier circuitry 600 arranged such that the output of the SMPS 6 is modulated with a reduced bandwidth version of the envelope input signal 2 to further increase efficiency of the envelope amplifier Amp 1. The circuitry 600 as shown in FIG. 12 depicts an arrangement in which the amplifier circuitry 100 of FIG. 5 may also be incorporated an SMPS 6 to amplify a low frequency component of the envelope signal to increase the efficiency of an envelope modulator incorporating this circuitry 600. As can be seen from in FIG. 12, in contrast to the envelope modulator of FIG. 1, the linear amplifier of FIG. 1 is replaced with the amplifier circuitry 100 of FIG. 5. The envelope input 2 is provided to the biasing network 4 as well as to a filtering and processing unit 5. Therefore, in contrast to the arrangement in FIG. 1, the entire bandwidth of the envelope input is provided to Amp 1 via the biasing network 4, rather than only a high frequency signal component, as is in the case in FIG. 1. The entire bandwidth of the signal 2 is passed to the biasing network 4 for being amplified by the amplifier circuitry 100 when the input voltage range of the envelope input 2 is above threshold level Vt. As in FIG. 5, capacitor C1 is used to feed the amplified signal V3 to the voltage supply input of the RF amplifier RF PA 8. A reduced bandwidth of the envelope input signal 2, i.e. a low frequency signal component, is extracted by filtering and processing unit 5 and passed to an SMPS 6 to further amplify the low frequency component of the envelope signal 2. The amplified signal provided by the SMPS 6 is fed to the voltage supply input of the RF amplifier RF PA 8. Thus, though a low frequency component is extracted for feeding the output voltage V3 for RF PA, the envelope amplifier Amp 1 still receives the entire bandwidth of the input signal 2. Therefore, the circuit 600 of FIG. 12 greatly improves the efficiency of an envelope modulator incorporating the circuitry 600, while at the same time avoiding the drawbacks of the existing split frequency architecture of FIG. 1.

Figure 13:
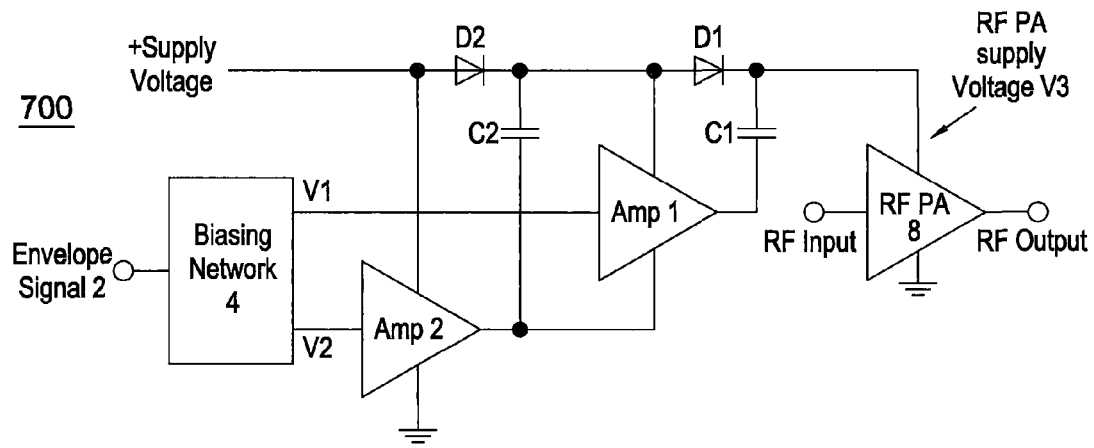
FIG. 13 shows an amplifier circuit according to a fourth embodiment combined with a plurality of antennas cascaded with power supplies.

FIG. 13 shows amplifier circuitry 700 according to a fourth embodiment in which the amplifier circuit 100 of FIG. 5 is provided in combination with the stacked amplifier circuit shown FIG. 4 to further increase efficiency and/or peak output voltage for the RF PA 8. In this arrangement two envelope amplifiers Amp 1 and Amp 2 are shown, each operating in a similar manner as explained above in relation to Amp 1 FIG. 5. Therefore, Amp 1 operates such that V1 based on the envelope input signal voltage is only provided to Amp 1 if the envelope voltage range is at or above a first threshold Vt1. Amp 2 operates using a different threshold Vt2 such that Vt2>Vt1. Therefore, in addition to V1, a voltage also appears at V2 in the upper part of the envelope signals voltage range, where V2 is at or more than Vt2. In this case, the higher output voltage at C2 can increase the voltage provided as input to Amp 1 above Vt2 as well as raise the supply voltage to the RF PA 8. The biasing network 4 may incorporate two or more zener diodes having different breakdown voltages to pass input signals with voltages over the threshold levels Vt1 and Vt2 to the respective envelope amplifiers. The embodiment of FIG. 13 can include more than two envelope amplifiers. Though in this embodiment the amplifiers Amp 1 and Amp 2 will still need to be synchronised in time, gain etc.; since only the upper voltage range of the input envelope signal 2 is tracked, linearity and efficiency of the circuitry and the output signal driving the RF PA 8 is greatly improved. The operating range of the RF PA 8 shown in FIG. 13 will be broken into three sections here. Referring to FIG. 7, there would be three operating ranges with three high efficiency peaks for the circuitry 700, not just two (as is the case for the circuitry 100 of FIG. 5). The RF PA will operate in a linear mode in the bottom range, but during the middle and top it will operate in a saturation mode.

Figure 14:
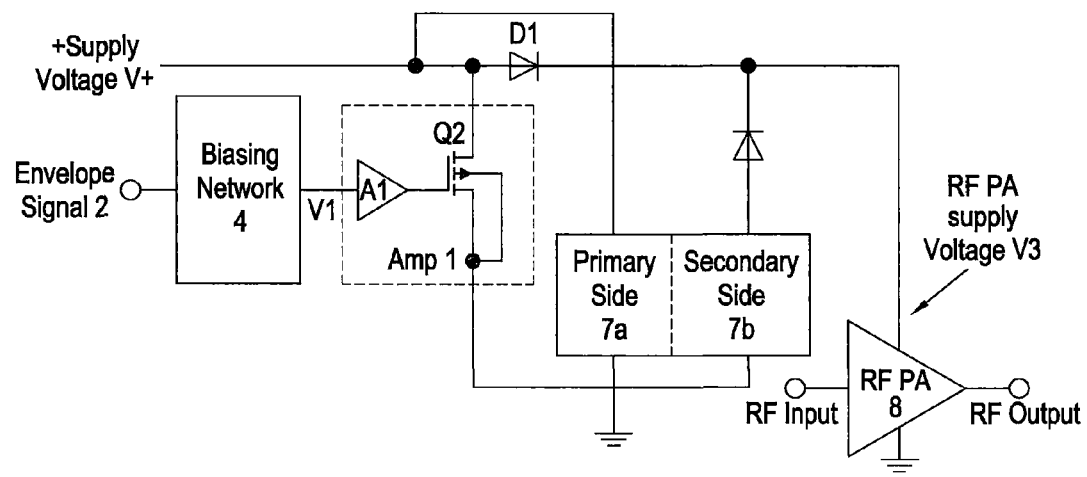
FIG. 14 shows an amplifier circuit according to a fifth embodiment including an isolated SMPS.

FIG. 14 shows an amplifier circuitry 800 for an envelope modulator in a fifth embodiment whereby the charge pump capacitor C1 of the circuitry 100 of FIG. 5 is replaced by an isolated SMPS 7. The isolated SMPS 7 has electrically isolated primary and secondary sides 7a and 7b, respectively. Power is transferred from primary 7a to secondary 7a at a high efficiency via an integrated transformer (not shown). This working of the envelope modulator Amp 1 is the same as explained in relation to FIG. 5, except that the output from Amp 1 is passed to the isolated SMPS 7 to amplify the envelope signal for feeding this to the RF PA 8.

The SMPS 7 is isolated in that the primary 7a and secondary 7b are electrically insulated from each other. There is no direct connection between them. Therefore, a voltage offset can be introduced on either primary 7a or secondary 7a by an additional power supply, without this offset affecting the other half. In the amplifier circuitry 800 of FIG. 14, the primary and secondary are configured to have a ratio of slightly less than 1, i.e. the secondary has an output voltage slightly less than +V. When the envelope is in the lower range (lower than Vt), the source of Q2 will be low. If the output isolated SMPS is slightly less than V+, then current will flow through D1 in favour of D2. If a voltage is present on the gate of Q2, then its drain will start to rise. This will push the output of the isolated SMPS above V+. Therefore current will tend to flow through D2 instead of D1 in circuitry 800. In this case, current to the RF PA 8 (V3) will flow through V+, Q2, the isolated SMPS and D2 into the RF PA 8.

The circuitry 800 of FIG. 14 is can be used for high power applications.

The described embodiments as seem in the accompanying FIGS. 5-14 are preferably intended for small base stations and transmitters/terminals such as low power amplifiers for both terminals and Femtocell base stations, rather than large (>1 kW) type of transmitters. Such base stations may be operated according to an OFDM standard, such as the LTE or WiMAX standards. The transmitter may be operating according to the DVB standard. Some of the described embodiments may also be used for high power applications and larger transmitters. In this case, provisions for suitable power handling for the amplifiers of the amplifier circuitry must be made.

While certain embodiments have been described, these embodiments have been presented by way of example only, and are not intended to limit the scope of the inventions. Indeed, the novel devices, methods, and products described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope of the embodiments.

The invention claimed is:

1. Amplifier circuitry for an envelope modulator comprising:
 a linear amplifier configured to receive an input representing an envelope of a signal to be amplified;
 a charge storage device coupled to the amplifier for providing an amplified envelope signal for driving a load, the amplifier and charge storage device configured to receive a supply voltage;
 wherein the amplifier circuitry is configured such that responsive to voltage of the input envelope signal reaching or exceeding a defined threshold value, an input voltage based on the voltage of the received envelope signal is provided to the amplifier to enable the charge storage device to supply a charge above the supply voltage such that the output voltage of the load driven by the amplifier circuitry is increased above the supply voltage; and
 further comprising a biasing network for receiving the envelope signal and providing the input signal to the amplifier based on the voltage of the received envelope signal, when the voltage of the envelope signal is at or above the threshold voltage,
 wherein the biasing network comprises a zener diode configuration to provide the input signal to the amplifier when the voltage of the envelope signal exceeds the breakdown voltage of a zener diode controlling the input for the amplifier, the breakdown voltage being set to the threshold voltage.

2. The amplifier circuitry as claimed in claim 1, wherein the charge storage device is a capacitor.

3. The amplifier circuitry as claimed in claim 2, wherein, when the voltage of the received envelope signal is below the defined threshold value, the supply voltage flows through a diode to charge the capacitor to the supply voltage for supplying a charge at the supply voltage to the load driven by the amplifier circuitry.

4. The amplifier circuitry as claimed in claim 2, wherein, when the voltage of the received envelope signal is at or above the defined threshold value, the input signal provided to the amplifier causes an increase in charge stored in the capacitor above the supply voltage, wherein the charge supplied by the capacitor to the load driven by the amplifier circuitry is also increased by a same amount such that the output voltage of the load driven by the amplifier circuitry is increased above the supply voltage.

5. The amplifier circuitry as claimed in claim 1, wherein the linear amplifier is an amplifier circuit arranged in a totem-pole configuration having a push-pull output driver arranged using two MOSFETs of same polarity.

6. The amplifier circuitry as claimed in claim 5, further comprising a further charge storage device coupled to the amplifier circuit, the further charge storage device configured to double the voltage supplied to the load driven by the amplifier circuit.

7. Amplifier circuitry for an envelope modulator comprising:
 a linear amplifier configured to receive an input representing an envelope of a signal to be amplified;
 a charge storage device coupled to the amplifier for providing an amplified envelope signal for driving a load, the amplifier and charge storage device configured to receive a supply voltage;
 wherein the amplifier circuitry is configured such that responsive to voltage of the input envelope signal reaching or exceeding a defined threshold value, an input voltage based on the voltage of the received envelope signal is provided to the amplifier to enable the charge storage device to supply a charge above the supply voltage such that the output voltage of the load driven by the amplifier circuitry is increased above the supply voltage;
 wherein the linear amplifier is an amplifier circuit arranged in a totem-pole configuration having a push-pull output driver arranged using two MOSFETs of same polarity;
 wherein a switched mode power supply (SMPS) is coupled to the supply voltage that is provided to the amplifier and the charge storage device, the SMPS provided for generating a DC voltage higher than the supply voltage.

8. Amplifier circuitry for an envelope modulator comprising:
 a linear amplifier configured to receive an input representing an envelope of a signal to be amplified;
 a charge storage device coupled to the amplifier for providing an amplified envelope signal for driving a load, the amplifier and charge storage device configured to receive a supply voltage;
 wherein the amplifier circuitry is configured such that responsive to voltage of the input envelope signal reaching or exceeding a defined threshold value, an input voltage based on the voltage of the received envelope signal is provided to the amplifier to enable the charge storage device to supply a charge above the supply voltage such that the output voltage of the load driven by the amplifier circuitry is increased above the supply voltage;

wherein a switched mode power supply (SMPS) is coupled to the supply voltage that is provided to the amplifier and the charge storage device for controlling the supply voltage.

9. Amplifier circuitry for an envelope modulator comprising:
a linear amplifier configured to receive an input representing an envelope of a signal to be amplified;
a charge storage device coupled to the amplifier for providing an amplified envelope signal for driving a load, the amplifier and charge storage device configured to receive a supply voltage;
wherein the amplifier circuitry is configured such that responsive to voltage of the input envelope signal reaching or exceeding a defined threshold value, an input voltage based on the voltage of the received envelope signal is provided to the amplifier to enable the charge storage device to supply a charge above the supply voltage such that the output voltage of the load driven by the amplifier circuitry is increased above the supply voltage;
wherein a switched mode power supply (SMPS) is coupled to the supply voltage that is provided to the amplifier and the charge storage device, the SMPS configured to receive a low frequency component of the received envelope signal, whereby the supply voltage is modulated based on the received low frequency component.

10. Amplifier circuitry for an envelope modulator comprising:
a linear amplifier configured to receive an input representing an envelope of a signal to be amplified;
a charge storage device coupled to the amplifier for providing an amplified envelope signal for driving a load, the amplifier and charge storage device configured to receive a supply voltage;
wherein the amplifier circuitry is configured such that responsive to voltage of the input envelope signal reaching or exceeding a defined threshold value, an input voltage based on the voltage of the received envelope signal is provided to the amplifier to enable the charge storage device to supply a charge above the supply voltage such that the output voltage of the load driven by the amplifier circuitry is increased above the supply voltage; and
further comprising one or more further amplifiers coupled to one or more further charge storage devices, each amplifier configured for receiving an input voltage based on the voltage of the received envelope signal responsive to the voltage of the input envelope signal reaching or exceeding a defined threshold value, the threshold value being unique to each amplifier; wherein the one or more amplifiers are arranged so that an output of a second one of the amplifiers in the amplifier circuitry is connected to one of the charge storage devices, the charge storage device being connected to a first one of the amplifiers for supplying a charge to the first one of the amplifiers, whereby an increase in output voltage of the second amplifier causes the charge supplied to the first amplifier to increase above the supply voltage such that the output voltage of the load driven by the amplifier circuitry is increased above the supply voltage.

11. An envelope modulator comprising the amplifier circuitry as claimed in claim 1, the envelope modulator further comprising:
an RF input for receiving an RF signal that is to be amplified;
an envelope detector for providing an envelope input signal indicative of an instantaneous magnitude of the envelope of the RF signal to the amplifier circuitry; and
an RF power amplifier for providing an amplified RF output signal;
wherein, the amplifier circuitry is configured to feed an amplified envelope signal output to a voltage supply input of the RF power amplifier.

12. An RF amplifier comprising an envelope modulator according to claim 11.

13. A base station or a transmitter comprising an RF amplifier according to claim 12.

14. A method for amplifying a signal using the amplifier circuitry of claim 1, comprising:
providing an input signal representing an envelope of a signal to be amplified to a linear amplifier;
providing a charge storage device coupled to the amplifier for providing an amplified envelope signal for driving a load;
providing a supply voltage to the amplifier and charge storage device;
wherein, responsive to the voltage of the input envelope signal reaching or exceeding a defined threshold value, providing an input voltage based on the voltage of the received envelope signal to the amplifier to enable the charge storage device to supply a charge above the supply voltage, such that the output voltage of the load driven by the amplifier circuitry is increased above the supply voltage.

15. An envelope modulation method implemented by the envelope modulator of claim 11 comprising:
providing an RF input for receiving an RF signal that is to be amplified;
providing an envelope input signal by an envelope detector to the amplifier circuitry of the envelope modulator, the signal indicative of an instantaneous magnitude of the envelope of the RF signal;
amplifying the envelope signal in the amplifier circuitry having a plurality of amplifiers and one or more charge storage devices, and providing an amplified output; and
providing the amplified output to a voltage supply input of an RF power amplifier for amplifying the RF signal.

* * * * *